United States Patent [19]
Kerth et al.

[11] Patent Number: 5,644,257
[45] Date of Patent: Jul. 1, 1997

[54] SAMPLING CIRCUIT CHARGE MANAGEMENT

[75] Inventors: Donald A. Kerth, Austin, Tex.; Dan B. Kasha, Seattle, Wash.; Eric J. Swanson, Buda; Anthony G. Mellissinos, Austin, both of Tex.

[73] Assignee: Crystal Semiconductor Corporation, Austin, Tex.

[21] Appl. No.: 635,570

[22] Filed: Apr. 22, 1996

Related U.S. Application Data

[63] Continuation of Ser. No. 350,498, Dec. 6, 1994, abandoned, which is a continuation of Ser. No. 36,471, Mar. 24, 1993, abandoned.

[51] Int. Cl.⁶ .......................... H03K 5/159; G06G 7/10
[52] U.S. Cl. ................... 327/96; 327/91; 327/94; 327/271; 327/362
[58] Field of Search ..................... 307/352, 353, 307/491, 607; 328/151; 327/91, 94, 96, 362, 271

[56] References Cited

U.S. PATENT DOCUMENTS

| | | | |
|---|---|---|---|
| 4,698,596 | 10/1987 | Haigh et al. | 328/127 |
| 4,823,027 | 4/1989 | Takahashi | 327/96 |
| 5,111,072 | 5/1992 | Seidel | 327/96 |
| 5,187,390 | 2/1993 | Scott, III | 307/353 |
| 5,351,050 | 9/1994 | Thompson et al. | 341/143 |

OTHER PUBLICATIONS

Data sheet, "CS5016 CS5014 CS5012A 16, 14 & 12–Bit, Self–Calibrating A/D Converters," 1992 Crystal Semiconductor Data Book, pp. 3-24—3-25.

Sooch, N.S. et al., "18–Bit Stereo D/A Converter with Integrated Digital and Analog Filters", 1991 Audio Engineering Society Preprint, Presented at the 91st Convention 1991, Oct. 4–8, New York.

*Primary Examiner*—Wael Fahmy
*Assistant Examiner*—Fetsum Abraham
*Attorney, Agent, or Firm*—Robert D. Lott

[57] ABSTRACT

The detrimental nonlinear charging currents from an analog input signal through an anti-aliasing filter into a sampling circuit can be minimized by using primary and secondary inputs to the sampling circuit. The secondary input is turned on before the primary input and the charge required to charge the parasitic capacitance inside the sampling circuit and to replenish the channeling charge lost in the previous cycle is supplied primarily through the secondary input. Immediately after the secondary input is turned off the primary input is connected to the sampling node, and only the charge required to fine tune the signal into the sampling capacitor is drawn through the primary input. Therefore, most of the non-linear charge injection is passed through the secondary input, and the signal passed through the primary input is used to fine tune the voltage levels inside the sampling circuit during the actual sampling operation.

12 Claims, 5 Drawing Sheets

SAMPLING CIRCUIT CHARGE MANAGEMENT

This is a continuation of application Ser. No. 08/350,498, filed on Dec. 6, 1994, which is a continuation of application Ser. No. 08/036,471, filed on Mar. 24, 1993, both now abandoned.

TECHNICAL FIELD

The present invention relates to sampling circuits, and more particularly, to charge management within the sampling circuits.

BACKGROUND OF THE INVENTION

In analog-to-digital converters, such as delta-sigma A/D converters, the continuous-time analog input must be sampled. Non-linear charge injection from the sampling switches limit the linearity of the converter. Various methods have been used in the past to improve the linearity of prior art sampling networks in order to provide analog-to-digital converters having signal to distortion ratios of 100–110dB. However, additional linearity improvements are required to go beyond 110 dB.

In order to avoid high frequency noise, it is a general practice in industry to provide an anti-alias filter in the continuous-time to discrete-time interface of the sampling circuit. This filter for over-sampled systems is usually a passive RC network. Such filters are often shown in data sheets for high precision A/D converters. For example, the Crystal Semiconductor Corporation Data Book, Volume 1, A/D Conversion IC's, April 1992, shows on pages 2-164 and 2-182 single ended RC filters, and on pages 2-198 and 2-216 differential input single ended filters. The Crystal data sheet for the CS5389, dated February, 1993, shows on page 6 a differential input differential filter. Another example is the Analog Devices data sheet for the AD1879, dated May 30, 1991, which shows differential input differential filters in FIGS. 17, 18, and 24a.

The charging current required by the sampling network must be supplied by the filter. This current develops a voltage drop across the input resistor of the filter. The sampled waveform will be distorted if the current has a non-linear dependency on the analog input.

One method used in the past to overcome this distortion is to place a unity gain amplifier inside the integrated circuit at the input voltage terminal. The output of the unity gain amplifier to used to rough charge the sampling capacitor and then the input voltage terminal is connected to the sampling capacitor directly to fine charge the capacitor. Such a circuit is shown in FIG. 2 on page 6-111 of the aforementioned Crystal data book. However the unity amplifier must have its gain and operation characteristics carefully controlled, and it is very difficult to provide a unity gain amplifier which can provide outputs which are close to the Vss or Vdd supply voltages. At these extreme voltage swings the distortion is worst. When the unity gain amplifier is needed the most, when the input is near one of the supply voltages, the unity gain amplifier provides little benefit.

Therefore it will be appreciated that a sampling circuit which reduces the nonlinear effects of charge injection for a wide range of input signals is highly desirable.

SUMMARY OF THE INVENTION

It is therefore an object of this invention to provide a sampling circuit in which the nonlinear effects of charge injection are reduced.

Shown in an illustrated embodiment of the invention is a sampling circuit having a primary input and a secondary input for receiving analog signals, and an output for providing a sampled signal. A charge is first passed through the secondary input, and then a charge is passed through the primary input during the charging phase of each sampling period.

Also shown in an illustrated embodiment of the invention is a sampling circuit having first and second input terminals and first and second input switches, the first and second input switches each having one terminal connected together to form a first internal node and the other terminal of the first input switch coupled to the first input terminal and the other terminal of the second input switch coupled to the second input terminal. The first input switch is controlled by a first timing signal and the second input switch is controlled by a second timing signal. The first internal node is coupled to ground through a third switch controlled by a third timing signal. A capacitor is coupled between the first internal node and an output terminal. Coupled between the output terminal and ground are fourth and fifth switches connected in parallel, with the fourth switch controlled by the first timing signal and the fifth switch controlled by the second timing signal. By the application of the first, second and third timing signals in succession, a charge proportional to the analog input signal on the second input terminal at the termination of the second timing pulse is produced at the output terminal at the end of the third timing pulse.

BRIEF DESCRIPTION OF THE DRAWINGS

The aforementioned and other features, characteristics, advantages, and the invention in general, will be better understood from the following more detailed description taking in conjunction with the accompanying drawings in which.

It will be appreciated that, where considered appropriate, reference numerals and letters have been repeated in the figures to indicate corresponding features.

DESCRIPTION OF THE PREFERRED EMBODIMENT

Figure 1A:
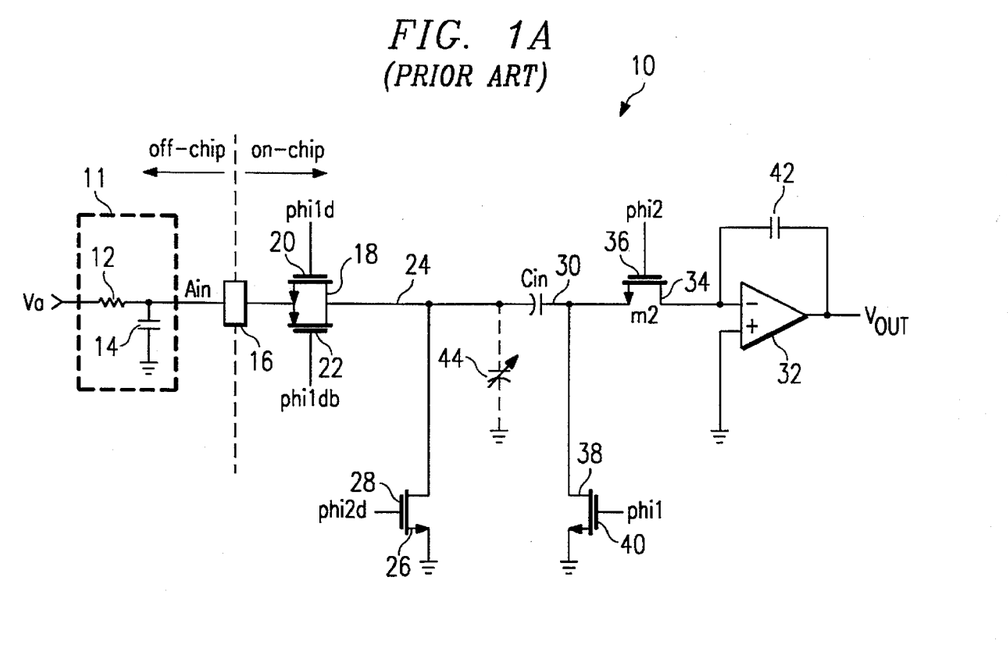
FIG. 1A is a schematic diagram of a prior art sampling circuit.

Turning now to the drawings, FIG. 1A is a prior art sampling circuit used to show the distortion produced by the non-linear dependency of the input current with respect to the input voltage. The sampling circuits shown in the drawings are of a type often used in delta-sigma analog-to-digital converters. As shown in FIG. 1A input voltage Va is coupled through an anti-aliasing filter 11 consisting of a series resistor 12 and a parallel capacitor to ground 14. The common node formed by the resistor 12 and the capacitor 14 is connected to an input terminal 16 of an integrated circuit. The vertical dashed line in FIG. 1A separates circuitry which is on an integrated circuit chip (to the right of the dashed line) and circuitry which is external to the integrated circuit chip (to the left of the dashed line). The input signal at the input terminal 16 is shown as Ain. The input terminal 16 is connected through an MOS transmission gate switch 18 which consists of an n-channel transistor 20 and a p-channel transistor 22 connected in a conventional manner. The n-channel transistor 20 is driven by a timing signal phi1d and the p-channel transistor 22 is driven by a timing signal phi1db.

The other terminal of the switch 18 is connected to a node 24 which in turn is coupled to ground through a switch 26 which is shown as an n-channel transistor 28 driven by timing signal phi2d. A sampling capacitor Cin is connected from node 24 to another node 30. Node 30 is coupled to the negative input of an operational amplifier 32 through a switch 34. Switch 34 consists of an n-channel transistor 36, the gate of which is coupled to a timing signal phi2. Node 30 is also coupled to ground by a switch 38 which is shown as an n-channel transistor 40 having a gate controlled by timing signal phi1. A noninverting input of the operational amplifier 32 is connected to ground, and the output of the operational amplifier 32 forms an output signal Vout. The output of the operational amplifier 32 is also connected coupled back to the inverting input of the operational amplifier 32 through a feedback capacitor 42. Also shown in FIG. 1A in phantom is a parasitic voltage dependent capacitor 44 which is coupled between node 24 and ground.

The non-linear parasitic capacitor 44 produces a non-linear charging current. The current through a full sampling period (i.e., the net charge transfer) required to repetitively charge the parasitic capacitor 44 is:

$$I = Ain \cdot fs \cdot C44_{(Ain)} \quad (1)$$

where fs is a sampling frequency, and $C44_{(Ain)}$ is the capacitance of capacitor 44 for a voltage of Ain across the capacitor. This capacitance is described as a function of the analog input signal Ain at node 16 since it represents the source/drain diffusion capacitance of transistors 20, 22 and 28. It will be understood by those skilled in the art that for an oversampled sampling circuit such as used in a delta-sigma modulator, analog input signal Ain can be assumed to be a DC voltage.

Figure 1B:
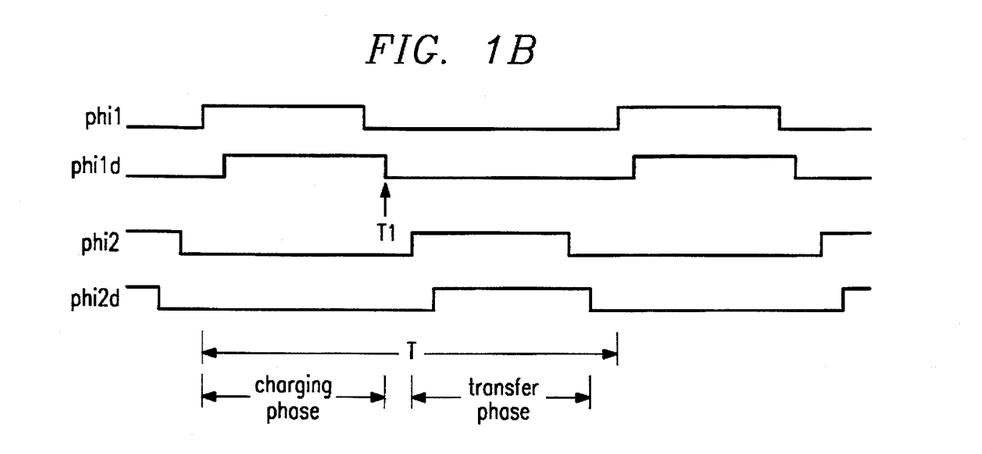
FIG. 1B is a timing diagram for the sampling circuit of FIG. 1A.

Another non-linear charging current is the charge injection of transistors 20 and 22 as discharged through switch 26. Turning now to the timing diagram of FIG. 1B, at the end of the first phase (phi1d), shown as T1 in FIG. 1B, the transmission gate 18 opens and injects its channel charge, Qch, into the input node 16 and the node 24. During the second phase, or charge transfer phase, when signal phi2 is high, switch 26 totally discharges node 24 thereby removing the charge injected from the transistors 20 and 22. The transistors 20 and 22 are again turned on during the next sampling cycle. The charge needed to support the channel in transistors 20 and 22, must be supplied by the anti-aliasing filter 11. Since a portion of this channel charge was injected into the filter 11 at time T1, the net charge that is supplied by the filter 11 is the portion that was removed by the switch 26, which is k times Qch where k is a number between 0 and 1. The charging current at the input terminal 16 is $$I = k \cdot Qch \cdot fs \quad (2)$$

where $$Qch = Qchn + Qchp \quad (3)$$

and $$Qchn = Wn \cdot Ln \cdot Coxn(Vdd - Ain - Vthn) \quad (4)$$

$$Qchp = Wp \cdot Lp \cdot Coxp(Vss - Ain - Vthp) \quad (5)$$

Qchn is the channel charge for an n-channel transistor, Qchp is the channel charge for a p-channel transistor, W and L are the width and length, respectively, of the transistors, and Cox is the gate oxide capacitance per unit area of the transistors. This channel charge has a non-linear dependence with the analog input through the threshold voltage body effect and, therefore, distorts the sampled waveform. Those skilled in the art will understand that, for this discussion, all input amplitude independent charge injection is ignored, such as the charge injection of transistors 40, 36, and 28.

Figure 2A:
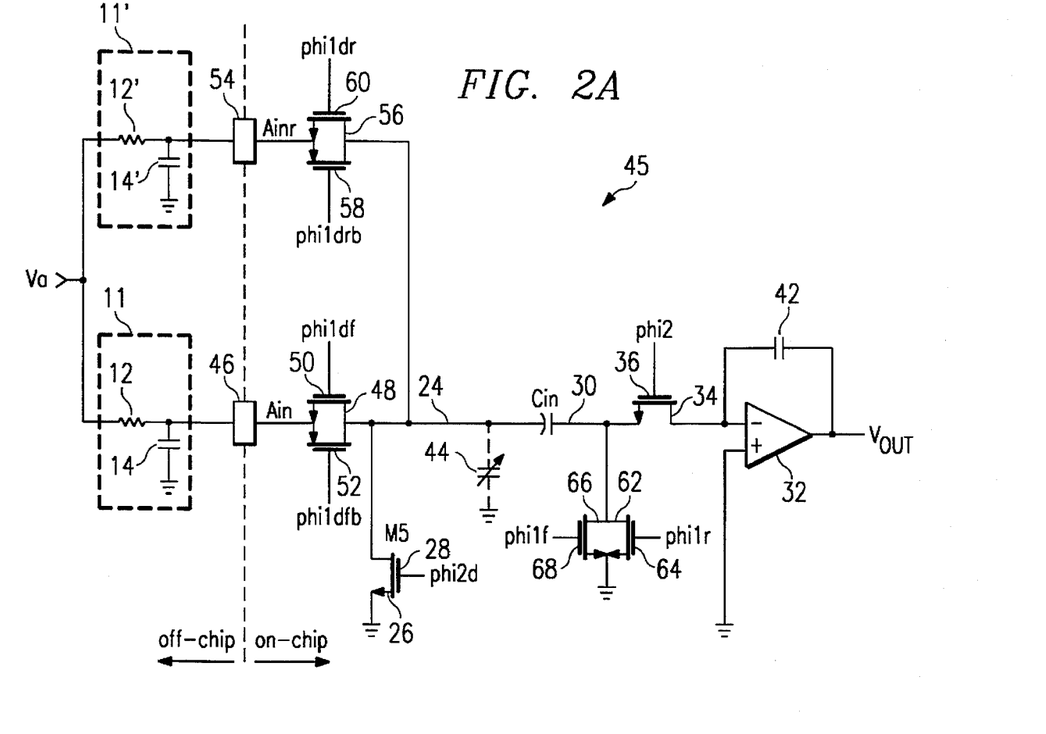
FIG. 2A is a schematic diagram of a sampling circuit according to the present invention.
Figure 2B:
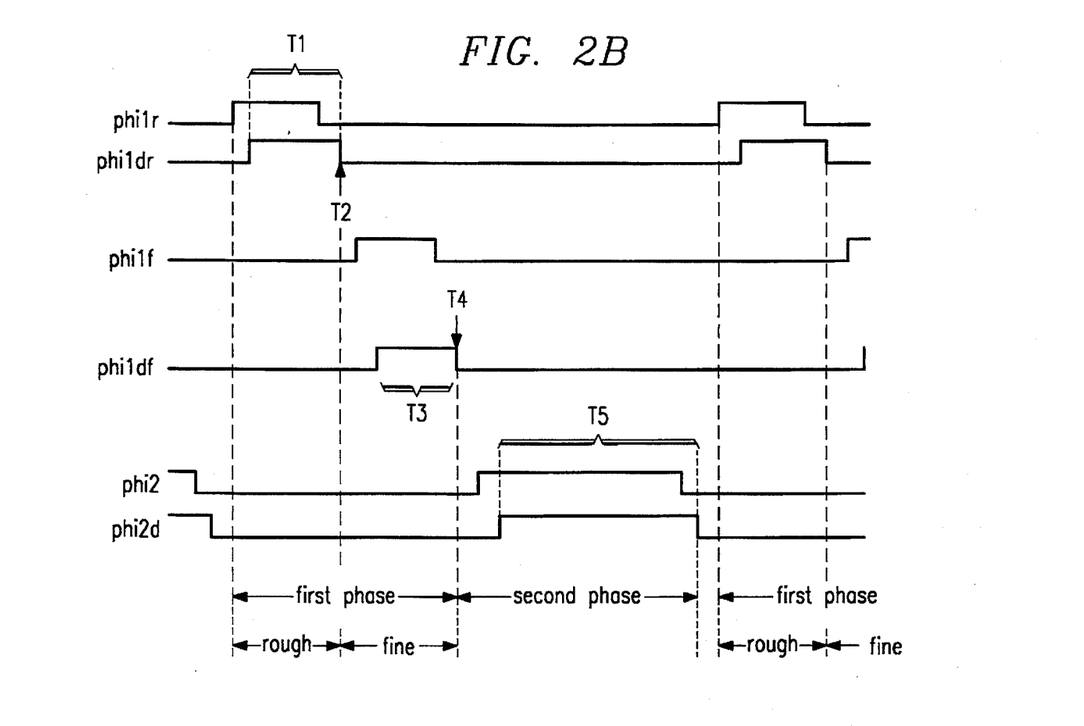
FIG. 2B is a timing diagram for the circuit shown in FIG. 2A.

FIG. 2A is a circuit diagram of a sampling circuit 45 which minimizes the non-linear charging currents described above. As shown in FIG. 2A, the input transmission gate 18 and switch 38 of FIG. 1A are split into rough and fine switches. The first phase timing is also split into rough and fine periods as shown in FIG. 2B. As shown in FIG. 2A the input signal Va is coupled into a primary input terminal 46 through the anti-aliasing filter 11 consisting of the resistor 12 and capacitor 14. The input signal Ain at node 46 is coupled through a fine transmission gate 48 consisting of a p-channel transistor 52 having its gate controlled by the timing signal phi1dfb (which is the inverse of phi1df) and an n-channel transistor 50 having its gate controlled by the timing signal phi1df. The input signal Va is also coupled through a second anti-aliasing filter 11' consisting of a resistor 12' and a capacitor 14' into a second input terminal 54 having an input signal Ainr. The input terminal 54 is coupled to node 24 through a rough transmission gate 56 consisting of a p-channel transistor 58 whose gate is controlled by the timing signal phi1drb, and an n-channel transistor 60 whose gate is controlled by the timing signal phi1dr. Node 30 is coupled to ground through two switches. A rough switch 62 consisting of an n-channel transistor 64 whose gate is controlled by the timing signal phi1r, and a fine switch 66 consisting of an n-channel transistor 68 whose gate is controlled by a timing signal phi1f.

In FIG. 2A it can been seen that the parasitic capacitor 44 is charged up to the analog input Va through the rough transmission gate 56. Therefore, the charging current for this capacitance is supplied by the secondary input at node 54. The primary input 46 only has to supply small correction voltages to the input and parasitic capacitance 44 during the fine phase (phi1df high and phi1dfb low). The non-linear current flows in the secondary filter 11' while the analog input Va is sampled from the primary anti-aliasing filter 11.

The non-linear current due to the transmission gate channel charge of transistors 50 and 52 is also diverted through the secondary input node 54. At the end of the fine phase, shown as time T4 in FIG. 2B, the fine transmission gate 48 is turned off and it injects charge into the primary input terminal 46 and node 24. During the second phase, the phi2 and phi2d phases, switch 26 removes the injected charge from node 24. The rough transmission gate 56 is turned on during the rough phase (phi1dr high and phi1drb low) to charge up the input capacitance. At the end of this phase, shown as time T2 in FIG. 2b, the rough transmission gate 56 injects its channel charge into node 24 and terminal 54. If the rough signal path consisting of filter 11' and transmission gate 56, is well matched with the fine signal path consisting of filter 11 and transmission gate 48, then the channel charge injected from transmission gate 56 into node 24 will match the channel charge injected from transmission gate 48. When the fine transmission gate 48 turns on during the phi1f phase, the charge required to support the transistor channels is supplied by the primary input terminal 46 and node 24. The net current required by the primary anti-aliasing filter 11 is just the mismatch of the charge injection of the rough transmission gate 56 and the fine transmission gate 48. In the preferred embodiment the critical transistors are laid out using photolithographic invariance (devices laid in exactly the same orientation) using methods known in the art.

Figure 3A:
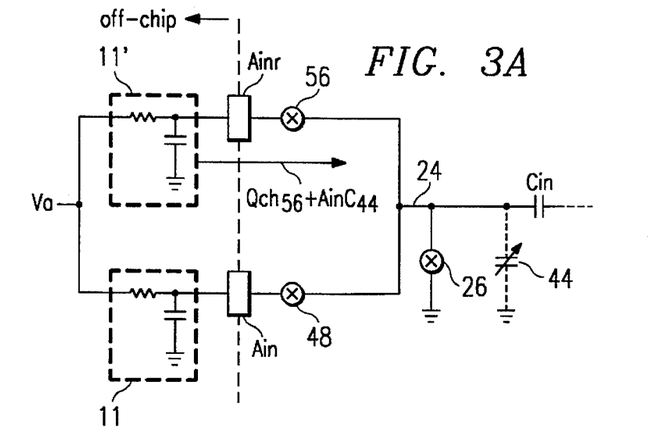
FIG. 3A is an equivalent circuit of a portion of FIG. 2A during a first time period.

FIGS. 3A–3E are equivalent circuits of a portion of FIG. 2A showing the filters 11 and 11', the rough transmission gate 56, the fine transmission gate 48 and the switch 26 in order to analyze the non-linear charge transfers during each sampling cycle. FIG. 3A shows the charge injected at time T1 in FIG. 2B. At this time the non-linear charge supplied by the filter 11, the filter 11', and the charge supplied from ground, Q0, into switch 26 is:

$$Q11(T1) = 0 \tag{6}$$

$$Q11'(T1) = Ainr \cdot C_{44} + Qch_{56} \tag{7}$$

$$Q0(T1) = 0 \tag{8}$$

where Q11 is the charge supplied by the filter 11, Q11' is the charge supplied by the filter 11', Q0 is the charge supplied from ground, and $Qch_{56}$ is the channel charge from switch 56.

Figure 3B:
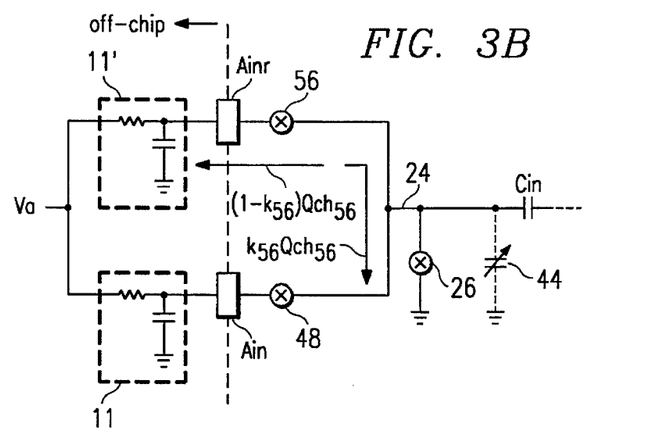
FIG. 3B is an equivalent circuit of a portion of FIG. 2A during a second time period.

FIG. 3B shows the charge injected at time T2 of FIG. 2B. $k_{56}$ is the proportion of the charge of switch 56 transferred to node 24. At this time the non-linear charge supplied by the filter 11, the filter 11', and the charge supplied from ground, Q0, is:

$$Q11(T2) = 0 \tag{9}$$

$$Q11'(T2) = -(1-k_{56}) \cdot Qch_{56} \tag{10}$$

$$Q0(T2) = 0 \tag{11}$$

Figure 3C:
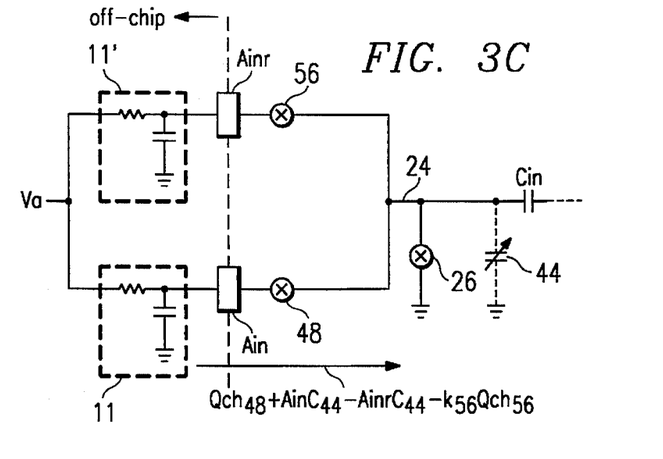
FIG. 3C is an equivalent circuit of a portion of FIG. 2A during a third time period.

FIG. 3C shows the charge injected at time T3 of FIG. 2B. $k_{48}$ is the proportion of the charge of switch 48 transferred to node 24, and $Qch_{48}$ is the channel charge from switch 48. At this time the non-linear charge supplied by the filter 11, the filter 11', and the charge supplied from ground, Q0, is:

$$Q11(T3) = Ain \cdot C_{44} + Qch_{48} - Ainr \cdot C_{44} - k_{56} \cdot Qch_{56} \tag{12}$$

$$Q11'(T3) = 0 \tag{13}$$

$$Q0(T3) = 0 \tag{14}$$

Figure 3D:
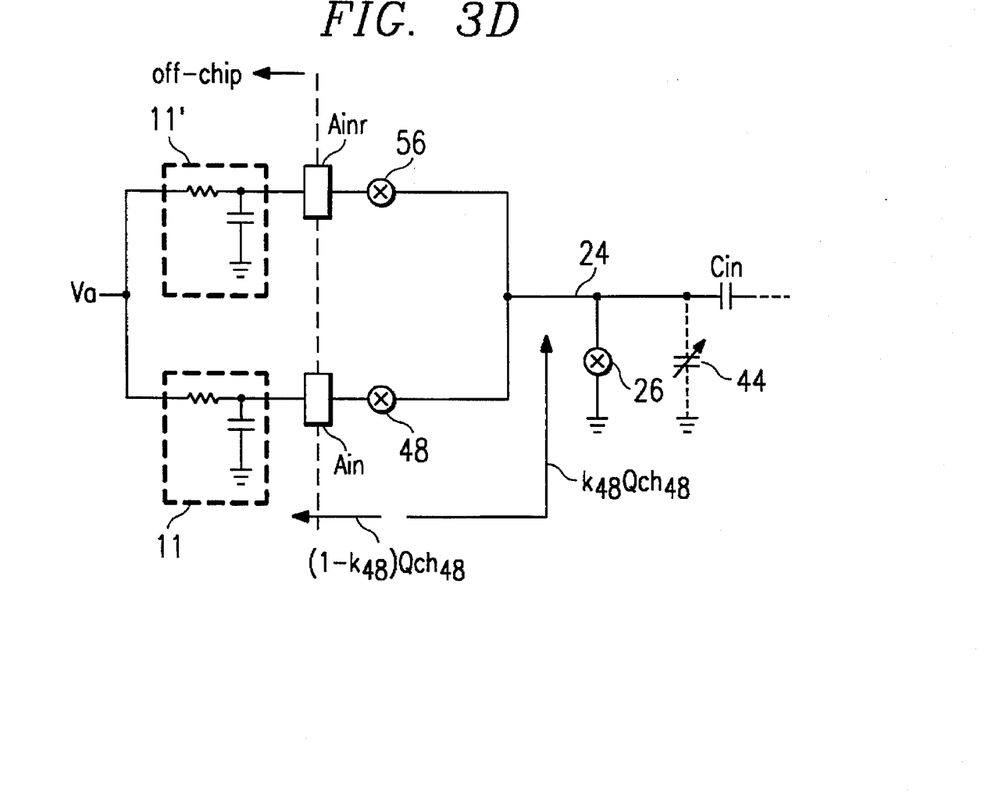
FIG. 3D is an equivalent circuit of a portion of FIG. 2A during a fourth time period.

FIG. 3D shows the charge injected at time T4 of FIG. 2B. At this time the non-linear charge supplied by the filter 11, the filter 11', and the charge supplied from ground, Q0, is:

$$Q11(T4) = -(1-k_{48}) \cdot Qch_{48} \tag{15}$$

$$Q11'(T4) = 0 \tag{16}$$

$$Q0(T4) = 0 \tag{17}$$

Figure 3E:
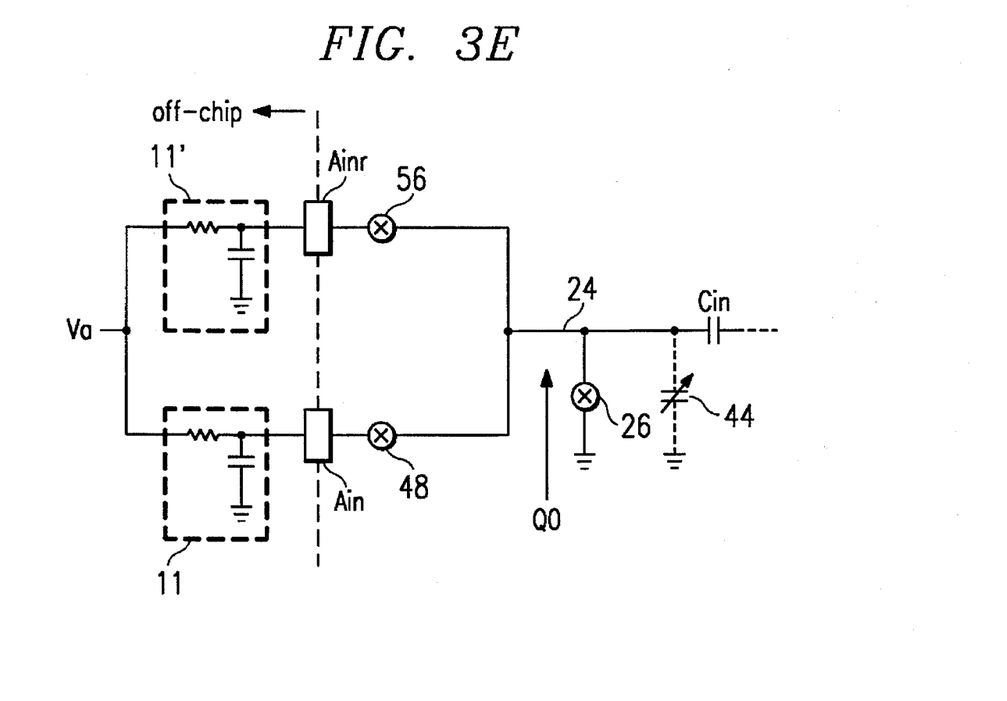
FIG. 3E is an equivalent circuit of a portion of FIG. 2A during a fifth time period.

FIG. 3E shows the charge transfered during time T5 of FIG. 3E. At this time the non-linear charge supplied by the filter 11, the filter 11', and the charge supplied from ground, Q0, is:

$$Q11(T5) = 0 \tag{18}$$

$$Q11'(T5) = 0 \tag{19}$$

$$Q0(T5) = -Ain \cdot C_{44} - k_{48} \cdot Qch_{48} \tag{20}$$

The net charge out of the primary or fine input (filter 11) is:

$$\begin{aligned} Q11(T1 \rightarrow T5) &= Q11(T1) + Q11(T2) + Q11(T3) + Q11(T4) + Q11(T5) \\ &= (Ain - Ainr) \cdot C_{44} + k_{48} \cdot Qch_{48} - k_{56} \cdot Qch_{56} \end{aligned} \tag{21}$$

Therefore if $k_{48}$ and $k_{56}$ are well matched, and if Ain is approximately Ainr, then the net charge into the primary input 46 will be essentially zero.

The charge through filter 11' and the rough input terminal 54 is:

$$\begin{aligned} Q11'(T1 \rightarrow T5) &= Q11'(T1) + Q11'(T2) + Q11'(T3) + Q11'(T4) + Q11'(T5) \\ &= Ainr \cdot C_{44} + k_{56} \cdot Qch_{56} \end{aligned} \tag{22}$$

This is essentially the charge that has been absorbed by the primary input in the prior art circuits which have produced signal to distortion ratios of 100–110 dB. 100 dB is approximately equivalent to one part in $10^5$. Therefore even though the matching of Ain and Ainr and the switch characteristics for switches 48 and 56 is not perfect, it can be seen that this invention helps greatly in lessening this type of distortion compared to prior art circuits. Also this invention operates across the full range of analog input voltages since both the rough and fine signal paths to the charging capacitor are passive rather than active as is the case with the unity gain amplifier described in the Background of the Invention.

The static and dynamic conditions when the rough transmission gate 56 and the fine transmission gate 48 are turned off must be well matched. The anti-aliasing filter 11' is replicated on the secondary input 54 so that the source impedance seen by their rough transmission gate 56 matches the source impedance of the fine transmission gate 48. Furthermore, the switch 38 of FIG. 1A is split into fine and rough sampling switches 66 and 62, respectively, so that glitch transients and impedances seen when the rough and fine transmission gates, 56 and 48 respectively, turn off are also well matched.

Figure 4:
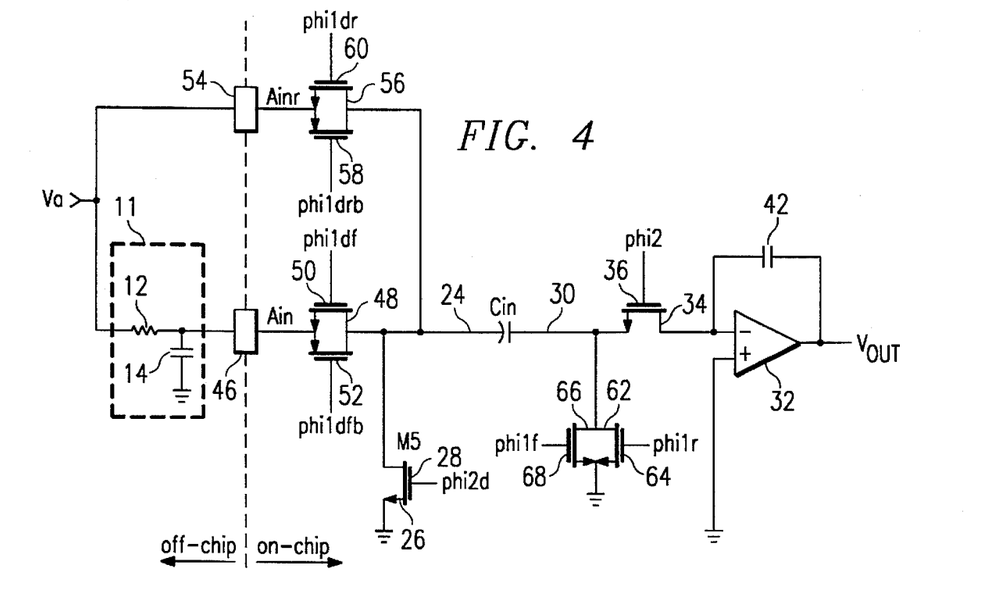
FIG. 4 is a schematic diagram of an alternate configuration using the present invention.

FIG. 4 shows a minimal configuration of the present invention if the absolute best reduction in charge injection nonlinearity is not required. As shown in FIG. 4 the secondary anti-aliasing filter has been removed and the input Va is connected directly to the secondary input terminal 54.

Figure 5:
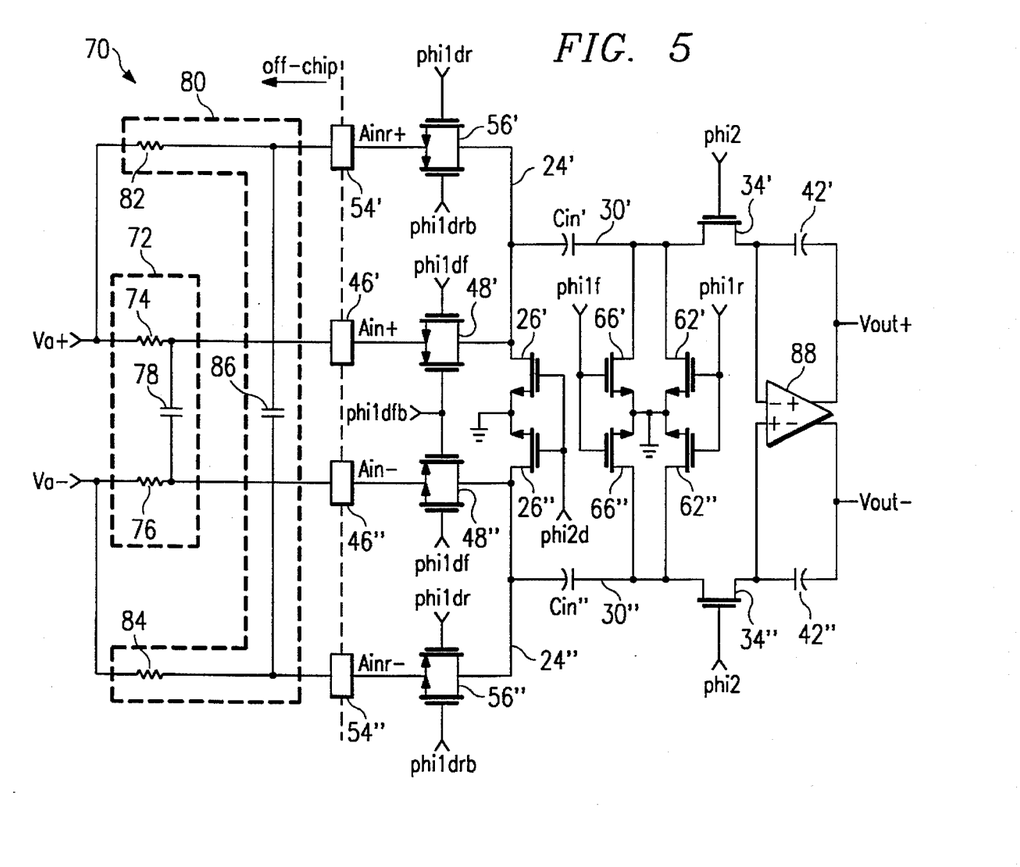
FIG. 5 is a schematic diagram of a differential configuration of the sampling circuit of FIG. 2A.

FIG. 5 is a schematic diagram of a differential input signal configuration of the circuit shown in FIG. 2A. As shown in FIG. 5, the differential sampling circuit 70 has a positive input signal Va+ and a negative input signal Va−. The positive input signal Va+ is coupled into a positive primary, or positive fine, input terminal of the integrated circuit chip shown as terminal 46'. The negative input signal Va– is coupled into a negative primary, or negative fine, input terminal of the integrated circuit chip shown as terminal 46". Interposed between the Va+ and Va– inputs and the terminals 46' and 46" is a filter 72 consisting of a first series resistor 74 connected between input Va+ and terminal 46', a second series resistor 76 connected between input Va– and terminal 46", and a shunt capacitor 78 connected between terminals 46' and 46".

The positive input signal Va+ is also coupled into a positive secondary, or positive rough, input terminal of the integrated circuit chip shown as terminal 54'. The negative input signal Va– is coupled into a negative secondary, or negative rough, input terminal of the integrated circuit chip shown as terminal 54". Interposed between the Va+ and Va– inputs and the terminals 54' and 54" is a filter 80 consisting of a first series resistor 82 connected between input Va+ and terminal 54', a second series resistor 84 connected between input Va– and terminal 54", and a shunt capacitor 86 connected between terminals 54' and 54".

Signal Ain+ appears at terminal 46' and is coupled through switch 48' to node 24'. Signal Ain– appears at terminal 46" and is coupled through switch 48" to node 24". Signal Ainr+ appears at terminal 54' and is coupled through switch 56' to node 24'. Signal Ainr– appears at terminal 54" and is coupled through switch 56" to node 24". Node 24' is coupled to ground through a switch 26' and to a node 30' through sampling capacitor Cin'. Similarly node 24" is coupled to ground through a switch 26" and to a node 30" through sampling capacitor Cin".

Node 30' is coupled to ground by two parallel switches 62' and 66' and to the inverting input of an operational amplifier 88 through a switch 34'. Similarly node 30" is coupled to ground by two parallel switches 62" and 66" and to the noninverting input of operational amplifier 88 through a switch 34".

The positive output of operational amplifier 88 forms the positive differential output signal, Vout+, and is also coupled back to the inverting input of the operational amplifier 88 through a feedback capacitor 42'. The negative output of operational amplifier 88 forms the negative differential output signal, Vout–, and is also coupled back to the noninverting input of the operational amplifier 88 through a feedback capacitor 42".

The switches shown in FIG. 5 are controlled by the same signals as the unprimed corresponding switches in FIG. 2A. Therefore the operation of FIG. 5 is the same as the operation of FIG. 2A except that differential input and output signals are processed.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. In an integrated circuit having first and second inputs for receiving first and second analog signals, respectively, from first and second passive circuits, respectively, said second passive circuit comprising a filter, a sampling circuit coupled to said first and second inputs, said sampling circuit comprising:

a) a charging circuit for charging a capacitor coupled to said first and second inputs during first and second time periods, respectively, during a charging phase of the sampling circuit, said charging circuit being coupled to said first and second inputs and said capacitor; and b) a transfer circuit for transferring the charge on said capacitor to an output terminal of said sampling circuit during a transfer phase of the sampling circuit, said transfer circuit being coupled to said capacitor and said output terminal.

2. In the integrated circuit set forth in claim 1, said first passive circuit comprises a filter.

3. A method for reducing the deleterious effects of non-linear capacitance in a sampling circuit comprising the steps of:

a) coupling an input signal to a charging capacitor through a first switch during a first portion of the charging phase of the sampling circuit;

b) coupling said input signal to said charging capacitor through a first filter and a second switch during a second phase of the charging phase, wherein said first phase precedes said second phase, and said second phase ends at approximately the same time that the sampling phase ends.

4. The method for reducing the deleterious effects of nonlinear capacitance in a sampling circuit as set forth in claim 3 wherein said step ELL includes the process of passing said input signal through a second filter and said first switch during said first phase of the charging phase.

5. A sampling circuit comprising:

a) first and second input terminals coupled to first and second passive circuits, respectively, with an input of each of said first and second passive circuits coupled together to form a primary input terminal, said second passive circuit comprising a filter;

b) first and second switches, said first switch being controlled by a first timing signal and said second switch being controlled by a second timing signal;

c) a capacitor, wherein said first switch is coupled between a first terminal of said capacitor and said first input terminal, and said second switch is coupled between said first terminal of said capacitor and said second input terminal;

d) a third switch coupled between said first terminal of said capacitor and a voltage source said third switch being controlled by a third timing signal;

e) an output terminal coupled to a second terminal of said capacitor;

f) fourth and fifth switches, both coupled between said output terminal and a reference voltage, said fourth and fifth switches being controlled by fourth and fifth timing signals, respectively, said fourth and fifth timing signals occurring approximately at the same time as said first and second timing signals, respectively, and not at the same time as said third timing signal; and g) wherein said first, second and third timing signals are applied in succession to provide a sampled signal at said output terminal.

6. The sampling circuit set forth in claim 5 wherein said first and second passive circuits each comprise anti-aliasing filters.

7. The sampling circuit set forth in claim 5 wherein said first and second switches are substantially matched to each other in order to minimize charging currents in said second switch.

8. A sampling circuit for providing a sampled output signal at an output terminal which is proportional to an analog input signal at an input terminal, said sampling circuit comprising:

a) first and second RC anti-aliasing filters, each having a first terminal coupled to the input terminal;

b) first and second switches, said first switch being controlled by a first timing signal and said second switch being controlled by a second timing signal;

c) a capacitor, wherein said first switch is coupled between a first terminal of said capacitor and a second terminal of said first RC anti-aliasing filter, and said second switch is coupled between said first terminal of said capacitor and a second terminal of said second RC anti-aliasing filter;

d) a third switch coupled between said first terminal of said capacitor and a voltage source, said third switch being controlled by a third timing signal;

e) an output terminal coupled to a second terminal of said capacitor;

f) fourth and fifth switches, both coupled between said output terminal and a reference voltage, said fourth and fifth switches being controlled by fourth and fifth timing signals, respectively, said fourth and fifth timing signals occurring approximately at the same time as said first and second timing signals, respectively, and not at the same time as said third timing signal; and g) wherein said first, second and third timing signals are applied in succession to provide a sampled signal at said output terminal.

9. The sampling circuit set forth in claim 8 wherein said voltage source is said reference voltage.

10. A sampling circuit having an input terminal coupled to an input of a first continuous time filter, the output of the continuous time filter coupled to a first charging circuit which charges a capacitor during a charging phase of the sampling circuit, and a transfer circuit coupled to said capacitor which transfers the charge on said capacitor to an output terminal of said sampling circuit during a transfer phase of the sampling circuit, the improvement comprising a second charging circuit coupled between said input terminal and said capacitor for charging said capacitor during said charging phase.

11. The sampling circuit set forth in claim 10 including a second continuous time filter coupled between said input terminal and an input of said second charging circuit.

12. The sampling circuit set forth in claim 11 wherein said first and second continuous time filters are passive anti-aliasing filters.

* * * * *